(12) United States Patent
Kim et al.

(10) Patent No.: US 10,490,255 B2
(45) Date of Patent: Nov. 26, 2019

(54) CIRCUIT FOR GENERATING PERIODIC SIGNAL AND MEMORY DEVICE INCLUDING SAME

(71) Applicant: SK hynix Inc., Gyeonggi-do (KR)

(72) Inventors: Seung-Chan Kim, Gyeonggi-do (KR); Saeng-Hwan Kim, Gyeonggi-do (KR); Sang-Hoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/878,876

(22) Filed: Jan. 24, 2018

(65) Prior Publication Data

US 2018/0151216 A1    May 31, 2018

Related U.S. Application Data

(62) Division of application No. 15/177,214, filed on Jun. 8, 2016, now Pat. No. 9,916,886.

(30) Foreign Application Priority Data

Dec. 30, 2015 (KR) .......................... 10-2015-0189312

(51) Int. Cl.
| | | |
|---|---|---|
| *G11C 11/4076* | (2006.01) | |
| *H03K 21/38* | (2006.01) | |
| *G11C 7/22* | (2006.01) | |
| *G11C 11/406* | (2006.01) | |
| *G06F 1/04* | (2006.01) | |

(52) U.S. Cl.
CPC ............ *G11C 11/4076* (2013.01); *G06F 1/04* (2013.01); *G11C 7/222* (2013.01); *H03K 21/38* (2013.01); *G11C 11/406* (2013.01)

(58) Field of Classification Search
CPC ..................................... G06F 1/04; G06F 1/08
USPC .......................................... 327/291–294, 298
See application file for complete search history.

(56) References Cited

U.S. PATENT DOCUMENTS

| 7,924,965 B2 * | 4/2011 | Tseng ........................ G06F 1/08 377/47 |
|---|---|---|
| 8,686,756 B2 * | 4/2014 | Hsu ........................ H03L 7/0997 326/93 |
| 9,009,520 B2 * | 4/2015 | Kossel ....................... G06F 1/04 713/503 |
| 9,543,044 B2 * | 1/2017 | Jain ......................... G11C 29/48 |

\* cited by examiner

*Primary Examiner* — Lincoln D Donovan
*Assistant Examiner* — Diana J. Cheng
(74) *Attorney, Agent, or Firm* — IP & T Group LLP

(57) ABSTRACT

Provided is a periodic signal generation circuit including: a clock generation unit suitable for generating first to $N^{th}$ clocks which have a basic period and have a phase increasing sequentially by a time interval obtained by dividing the basic period by "N"; a pulse generation unit suitable for generating first to $N^{th}$ periodic pulses having an equal pulse width and having a phase increasing sequentially by a time interval obtained by dividing the basic period by "N" by combining two or more clocks among the first to $N^{th}$ clocks; and a periodic signal generation unit suitable for generating a periodic signal by combining one or more periodic pulses among the first to $N^{th}$ periodic pulses depending on combination information.

5 Claims, 9 Drawing Sheets

CIRCUIT FOR GENERATING PERIODIC SIGNAL AND MEMORY DEVICE INCLUDING SAME

CROSS-REFERENCE TO RELATED APPLICATIONS

This application is a division of U.S. patent application Ser. No. 15/177,214 filed on Jun. 8, 2016 which claims priority of Korean Patent Application No. 10-2015-0189312, filed on Dec. 30, 2015. The disclosure of each of the foregoing applications is incorporated herein by reference in its entirety.

BACKGROUND

1. Field

Various embodiments of the present invention relate generally to a circuit for generating a periodic signal and a memory device including the same.

2. Description of the Related Art

A memory cell of a memory device may include a transistor serving as a switch and a capacitor for storing a charge (data). Depending on whether a charge may be stored in the capacitor of the memory cell, for example depending on whether a terminal voltage of the capacitor is high or low, it is determined whether the logic level of the stored data is high (logic 1) or low (logic 2).

Since data is stored in the form of accumulated charges in the capacitor of a memory cell, theoretically there is no power consumption for maintaining stored data. However, an initial charge stored in the capacitor may diminish due to a leakage current and as a result data may be lost. For preventing such data loss, data stored in the memory cells of a memory device are typically read periodically before the data are lost and the capacitors of the memory cells are recharged according to the read data. This operation is commonly known as a refresh operation.

Typically, a refresh operation is a self-refresh operation performed independently from other operations in a memory device. The period of the self-refresh operation is optimized for the memory device depending upon the retention time of the memory cell. For example, when the memory device has a long retention time the refresh operation period is lengthened to reduce current consumption, whereas when the memory device has a short retention time, the refresh operation period is shortened to minimize data loss. The retention time of a memory device is generally affected by the temperature in which the memory device operates.

Hence, it would be advantageous to employ an oscillator for generating a periodic signal having a period which varies depending on the temperature for adjusting the refresh operation period of a self-refresh operation of a memory device. However, heretofore such technology is not sufficiently precise.

Hence further improvements for reducing or preventing data loss due to current leakage and also for reducing the overall power consumption of a memory device are needed. Also, an improved technology for precisely adjusting the period of a periodic signal as a function of temperature, is required.

SUMMARY

Various embodiments of the invention are directed to a periodic signal generation circuit capable of generating periodic signals having various periods depending on temperature. The periodic signal generation circuit also has a smaller size than existing circuits.

In addition, various embodiments of the invention are directed to provide a memory device for perform self-refresh operations in various periods depending on temperature while reducing the size thereof using the periodic signal generation circuit.

In an embodiment, a periodic signal generation circuit may include: a clock generation unit suitable for generating first to $N^{th}$ clocks which have a basic period and have a phase increasing sequentially by a time interval obtained by dividing the basic period by "N"; a pulse generation unit suitable for generating first to $N^{th}$ periodic pulses having an equal pulse width and having a phase increasing sequentially by a time interval obtained by dividing the basic period by "N" by combining two or more clocks among the first to $N^{th}$ clocks; and a periodic signal generation unit suitable for generating a periodic signal by combining one or more periodic pulses among the first to $N^{th}$ periodic pulses depending on combination information.

In an embodiment, a periodic signal generation circuit may include: a clock generation unit suitable for generating first to $N^{th}$ division clocks by dividing a basic clock having a basic period one or N times, respectively; and a periodic signal generation unit suitable for transferring a periodic pulse having the basic period as a periodic signal when a logic value of the first to $N^{th}$ division clocks is equal to a value of combination information, wherein the clock generation unit is initialized when the periodic pulse is transferred as the periodic signal.

In an embodiment, a periodic signal generation circuit may include: first to $M^{th}$ period information storage units suitable for storing assigned period information among first to $M^{th}$ period information; an information selection unit suitable for selecting and outputting one of the first to $M^{th}$ period information in response to section information; and a signal generation unit suitable for generating a periodic signal having an assigned period in response to a plurality of clocks and combination information generated using an output of the information selection unit.

DETAILED DESCRIPTION

Figure 1:
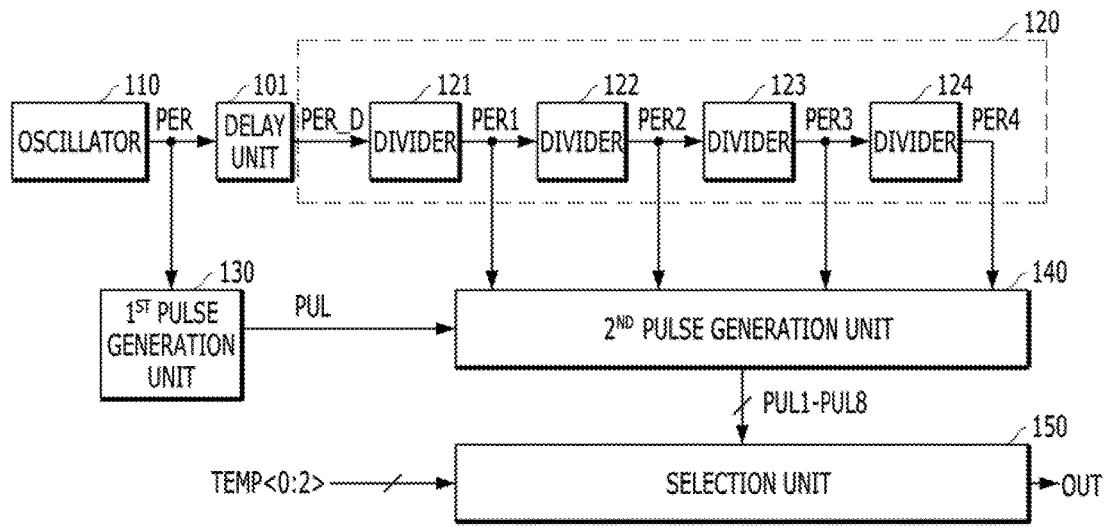
FIG. 1 is a block diagram illustrating a conventional periodic signal generation circuit.
Figure 2:
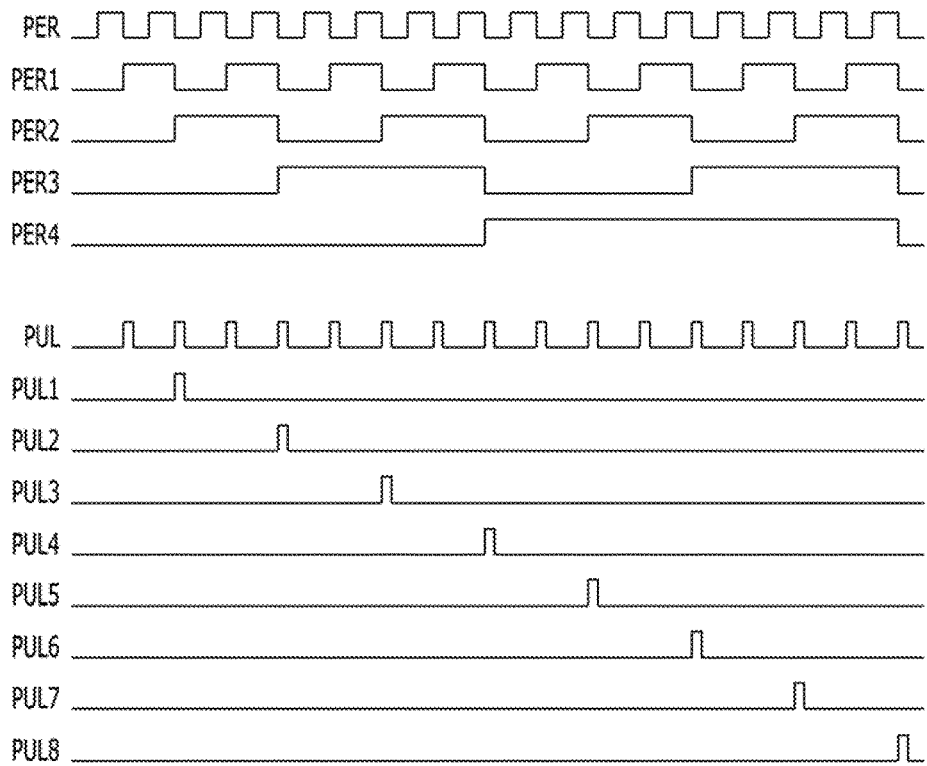
FIG. 2 is a waveform diagram explaining an operation of the conventional periodic signal generation circuit of FIG. 1.

Hereinafter, various embodiments will be described with reference to the accompanying drawings so that a person skilled in the art to which the present invention belongs can implement the technical concepts disclosed herein. The present invention however, may be embodied in various different forms, and should not be construed as being limited to the illustrated embodiments herein.

It will be also understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and not intended to be limiting of the present invention. As used herein, singular forms are intended to include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art, elements described in connection with a particular embodiment may be used singly or in combination with other embodiments unless otherwise specifically indicated.

Hereinafter, the various embodiments of the present invention will be described in detail with reference to the attached drawings.

Referring to FIG. 1, a conventional periodic signal generation circuit includes an oscillator 110, a division unit 120, a first pulse generation unit 130, a second pulse generation unit 140, and a selection unit 150.

The oscillator 110 generates a basic periodic signal PER having a basic period.

The division unit 120 includes four dividers 121-124, and generates first to fourth periodic signals PER1-PER4 obtained by dividing a frequency of the basic periodic signal PER by various division ratios. Each of the dividers 121-124 divides a frequency of an input signal by two to generate an output signal. Therefore, the frequency of the first periodic signal PER1 is one half of the frequency of the basic periodic signal PER, the frequency of the second periodic signal PER2 is one half of the frequency of the first periodic signal PER1, the frequency of the third periodic signal PER3 is one half of the frequency of the second periodic signal PER2, and the frequency of the fourth periodic signal PER4 is one half of the frequency of the third periodic signal PER3. The periods of the periodic signals PER and PER1-RER4 are inversely proportional to their frequencies, respectively. A delay unit 101 generates a delay signal PER_D by delaying the basic periodic signal PER by one half of the period of the basic periodic signal PER. The delay signal PER_D is inputted to the divider 121.

The first pulse generation unit 130 generates a periodic pulse PUL having an assigned pulse width at a falling edge of the basic periodic signal PER. The second pulse generation unit 140 combines the periodic pulse PUL with one or more of the first to fourth periodic signals PER1-PER4 to generate first to eighth periodic pulses PUL1-PUL8, each of which has the same period as the fourth periodic signal PER4 and has a phase difference increasing in regular sequence by a time interval obtained by dividing the period of the fourth periodic signal PER4 by eight. The selection unit 150 generates a periodic signal OUT by combining one or more of the first to eighth periodic pulses PUL1-PUL8 depending on temperature information TEMP<0:2>.

The conventional periodic signal generation circuit includes the dividers 121-124. In addition, the selection unit 150 included in the periodic signal generation circuit is configured to combine one or more of the first to eighth periodic pulses PUL1-PUL8 depending on the temperature information TEMP<0:2>, hence, the conventional periodic signal generation unit has a rather large footprint and occupies a large area in a semiconductor device. The required area largely increases as the number of periodic pulses to be combined increases. Therefore, the conventional periodic signal generation circuit shown in FIG. 1 requires a large area which is proportional to the number of the different periodic signals generated (signals having different periods). That is, if a larger number of different periodic signals is required the size of the conventional periodic signal generation circuit also increases.

Figure 3:
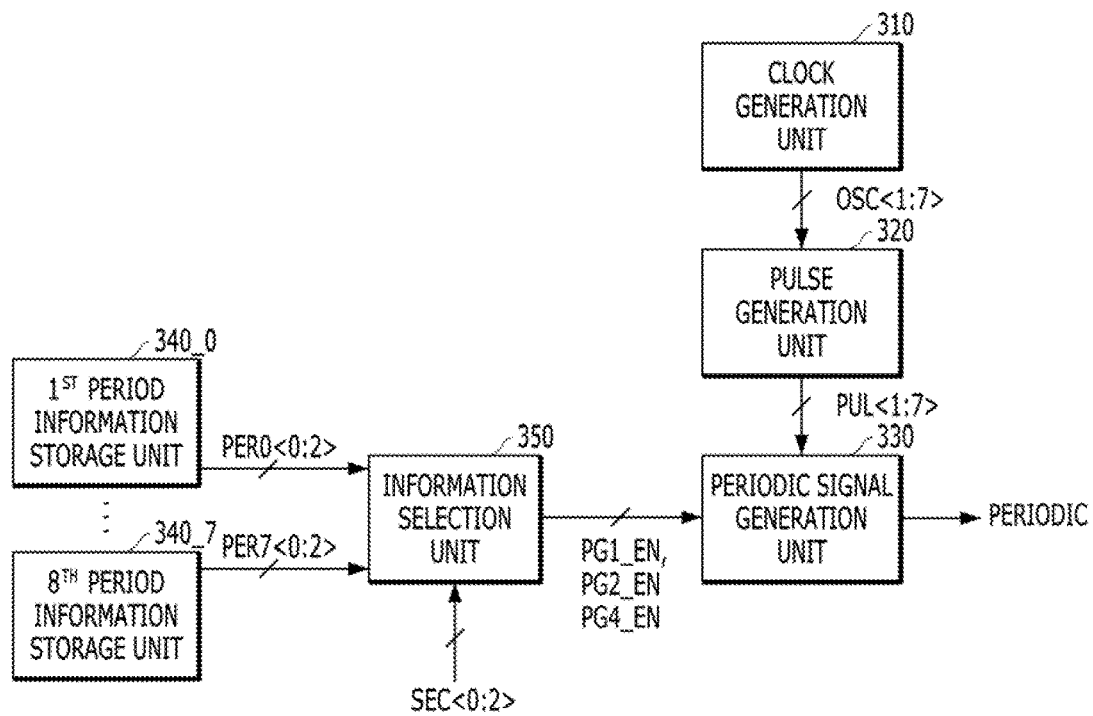
FIG. 3 is a block diagram illustrating a configuration of a periodic signal generation circuit, according to an embodiment of the present invention.

Referring now to FIG. 3, a periodic signal generation circuit is provided, according to an embodiment of the present invention. The periodic signal generation circuit is generally designated with numeral 300 and may include a clock generation unit 310, a pulse generation unit 320, a periodic signal generation unit 330, a plurality of M information storage units, for example, eight information storage units 340_0 to 340_7, and an information selection unit 350. M is a natural number.

The clock generation unit 310 may generate first to $N^{th}$ clocks, for example, seven clocks OSC<1:7> having a basic period and having a phase difference increasing in regular sequence by a time interval obtained by dividing the basic period by "N", wherein N is a natural number. The following description is for a case where seven clocks are generated, i.e., for N equals to seven. The clock generation unit 310 shown in FIG. 3 may generate first to $N^{th}$ clocks OSC<1:7> having a basic period and having a phase difference increasing in regular sequence by a time interval obtained by dividing the basic period by seven. When the basic period of the first to $N^{th}$ clocks OSC<1:7> is "T", and the phase of the first clock OSC<1> is zero, the second to $N^{th}$ clocks OSC<2:7> may have the phases of +T/7, +2T/7, +3T/7, +4T/7, +5T/7 and +6T/7, respectively.

The pulse generation unit 320 generate first to $N^{th}$ periodic pulses PUL<1:7> having the same pulse width and having a phase difference increasing in regular sequence by a time interval obtained by dividing the basic period T by "N" (i.e. by 7 for the example of FIG. 3), by combining two or more clocks of the first to $N^{th}$ clocks OSC<1:7>.

For example, the pulse generation unit 320 may generate a first periodic pulse PUL<1> by combining the first clock OSC<1> and the fifth clock OSC<5>, generate a second periodic pulse PUL<2> by combining the fifth clock OSC<5> and the second clock OSC<2>, generate a third periodic pulse PUL<3> by combining the second clock OSC<2> and the sixth clock OSC<6>, generate a fourth periodic pulse PUL<4> by combining the sixth clock OSC<6> and the third clock OSC<3>, generate a fifth periodic pulse PUL<5> by combining the third clock OSC<3> and the seventh clock OSC<7>, generate a sixth periodic pulse PUL<6> by combining the seventh clock OSC<7> and the fourth clock OSC<4>, and generate a seventh periodic pulse PUL<7> by combining the fourth clock OSC<4> and the first clock OSC<1>.

The periodic signal generation unit 330 may generate a periodic signal PERIODIC by combining one or more periodic pulses among the first to $N^{th}$ periodic pulses PUL<1:7> based on combination information PG1_EN, PG2_EN and PG4_EN. The periodic signal generation unit 330 may generate a periodic signal PERIODIC by combining periodic pulses corresponding to the combination information PG1_EN, PG2_EN and PG4_EN, among the first to $N^{th}$ periodic pulses PUL<1:7>.

The periodic signal generation unit 330 may combine periodic pulses corresponding to activated combination signals among first to $L^{th}$ combination signals PG1_EN, PG2_EN and PG4_EN included in the combination information PG1_EN, PG2_EN and PG4_EN to output the combination result as the periodic signal PERIODIC. Each of the first to third combination signals PG1_EN, PG2_EN and PG4_EN may correspond to one or more different periodic pulses, among the first to seventh periodic pulses PUL<1:7>.

A $K^{th}$ combination signal (K is a natural number, and satisfies the relationship 1≤K≤3) may correspond to $2^{K-1}$ periodic pulses. For example, the first combination signal PG1_EN may correspond to one periodic pulse PUL<4>, the second combination signal PG2_EN may correspond to two periodic pulses PUL<2> and PUL<6>, and the third combination signal PG4_EN may correspond to four periodic pulses PUL<1>, PUL<3>, PUL<5> and PUL<7>.

The first to M' period information storage units 340_340_7 may store and output assigned period information among first to $M^{th}$ period informations PER0<0:2>-PER7<0:2>. Each of the first to $M^{th}$ period information storage units 340_1-340_7 may be a fuse set which can program multi-bit information. The values of period information programmed in the first to $M^{th}$ period information storage units 340_-340_7 may be set freely depending on designs.

Each of the first to $M^{th}$ period information PER0<0:2>-PER7<0:2> may correspond to one operation section among first to $M^{th}$ operation sections divided depending on the value of an assigned factor. Here the assigned factor may be one of a plurality of factors for defining the environments in which a semiconductor device including a periodic signal generation circuit operates. For example, the assigned factor may be a temperature, such as the operating temperature of the semiconductor device.

Hereinafter, an operation section and period information will be described with an example in which the assigned factor is a temperature, such as, for example, the operating temperature of the semiconductor device. When a semiconductor device including a periodic signal generation circuit 300 operates in a temperature range of 0-80° C., the temperature range may be divided into first to $M^{th}$ operation sections. For M=8, the size of each operation section is 10° C., and the first to eighth operation sections are 0-10° C. to 70-80° C., respectively. The first to $M^{th}$ period informations PER0<0:2>-PER7<0:2> determine the period of a periodic signal PERIODIC in the first to $M^{th}$ operation sections, respectively, and the value of each period information may be set freely for each section regardless of the values of period information which correspond to different sections.

The information selection unit 350 may select one of the first to $M^{th}$ period informations PER0<0:2>-PER7<0:2> in response to section information SEC<0:2> to output the selected period information as combination information PG1_EN, PG2_EN and PG4_EN. In this case, a first bit PER0<0>-PER7<0> of the selected period information may be outputted as a first combination signal PG1_EN, a second bit PER0<1>-PER7<1> of the selected period information may be outputted as a second combination signal PG2_EN, and a third bit PER0<2>-PER7<2> of the selected period information may be outputted as a third combination signal PG_EN. The section information SEC<0:2> may be information representing an operation section n which a semiconductor device including a periodic signal generation circuit operates. For example, the section information SEC<0:2> may be information representing an operation section selected from operations sections of 0-10° C. to 70-80° C., wherein a semiconductor device may operate in the selected operation section. The section information SEC<0:2> may be generated using the result of a temperature measurement.

Table 1 shows assigned operation sections and period information PER0<0:2>-PER7<0:2> selected by the information selection unit 350, depending on the values of the section information SEC<0:2>.

TABLE 1

| Section Information (SEC<2>, SEC<1>, SEC<0>) | Operation Section | Selected Period Information |
|---|---|---|
| (0, 0, 0) | 1st operation section (0-10° C.) | 1st period information (PER0<0:2>) |
| (0, 0, 1) | 2nd operation section (10-20° C.) | 2nd period information (PER1<0:2>) |
| (0, 1, 0) | 3rd operation section (20-30° C.) | 3rd period information (PER2<0:2>) |
| (0, 1, 1) | 4th operation section (30-40° C.) | 4th period information (PER3<0:2>) |
| (1, 0, 0) | 5th operation section (40-50° C.) | 5th period information (PER4<0:2>) |
| (1, 0, 1) | 6th operation section (50-60° C.) | 6th period information (PER5<0:2>) |
| (1, 1, 0) | 7th operation section (60-70° C.) | 7th period information (PER6<0:2>) |
| (1, 1, 1) | 8th operation section (70-80° C.) | 8th period information (PER7<0:2>) |

The periodic signal generation circuit 300 shown in FIG. 3 does not employ a divider, hence, periodic signals having various periods can be generated with a reduced circuit area. In addition, since the period information suitable for the respective operation sections may be stored in a fuse set or the like in advance, and the period information may be selected and used based on the section information, the period of a periodic signal PERIODIC for each operation section can be set freely using a simple circuit.

Figure 4:
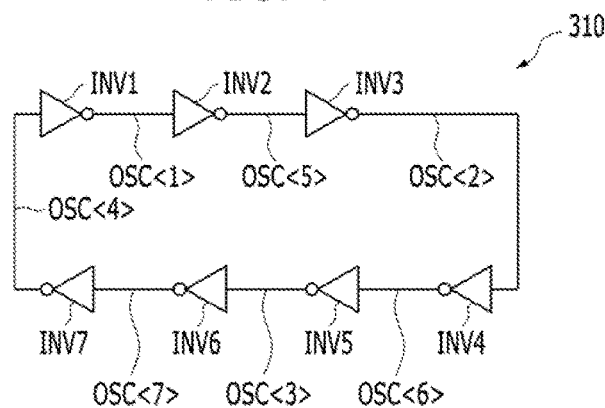
FIG. 4 is a circuit diagram illustrating a configuration of a clock generation unit, according to an embodiment of the present invention.

Referring now to FIG. 4, a clock generation unit 310 according to an embodiment of the present invention may include first to $N^{th}$ inverters, for example seven inverters INV1-INV7, wherein an output of a $K^{th}$ inverter INVK (K is a natural number that satisfies the relationship 1≤K<N) among the first to $N^{th}$ inverters INV1-INV7 is coupled to an input of a $(K+1)^{th}$ inverter INVK+1, and an output of the $N^{th}$ inverter, i.e., the seventh inverter INV7 in the example of FIG. 4, is coupled to an input of the first inverter INV1. For example, the outputs of the first to sixth inverters INV1-INV6 may be coupled to the inputs of the second to seventh inverters INV2-INV7, respectively, and the output of the seventh inverter INV7 may be coupled to the input of the first inverter INV1.

Figure 5:
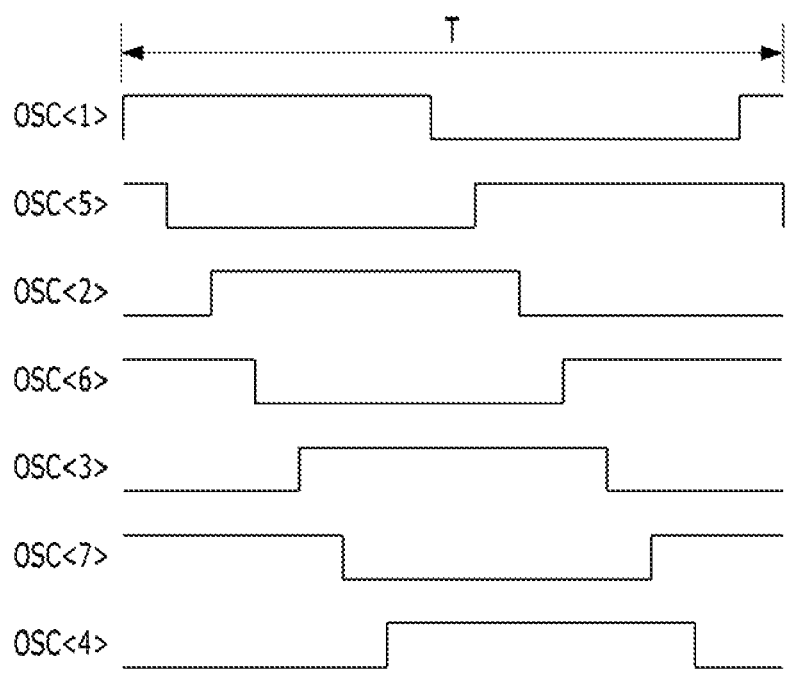
FIG. 5 is a waveform diagram explaining an operation of the clock generation unit, according to an embodiment of the present invention.

Referring to FIG. 5 which illustrates waveforms for explaining the operation of the clock generation unit 310, a basic period T may be twice as long as a time corresponding to a sum of delay values D of the first to $N^{th}$ inverters INV1-INV7.

Each of the first to $N^{th}$ clocks OSC<1:7> may be the output of one inverter among the first to $N^{th}$ inverters INV1-INV7. In FIGS. 4 and 5, the first clock OSC<1> may be the output of the first inverter INV1, the second clock OSC<2> may be the output of the third inverter INV3, the third clock OSC<3> may be the output of the fifth inverter INV5, the fourth clock OSC<4> may be the output of the seventh inverter INV7, the fifth clock OSC<5> may be the output of the second inverter INV2, the sixth clock OSC<6> may be the output of the fourth inverter INV4, and the seventh clock OSC<7> may be the output of the sixth inverter INV6.

Figure 6:
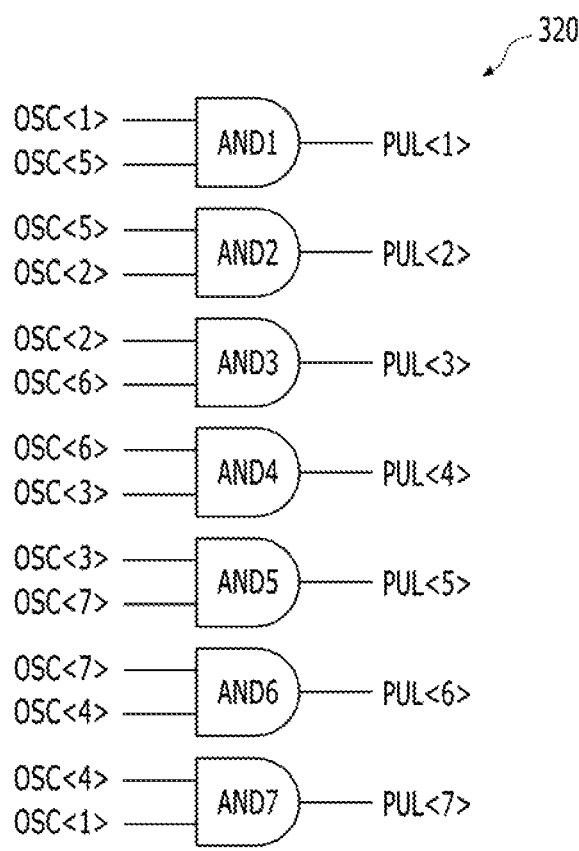
FIG. 6 is a circuit diagram illustrating a configuration of a pulse generation unit, according to an embodiment of the present invention.
Figure 7:
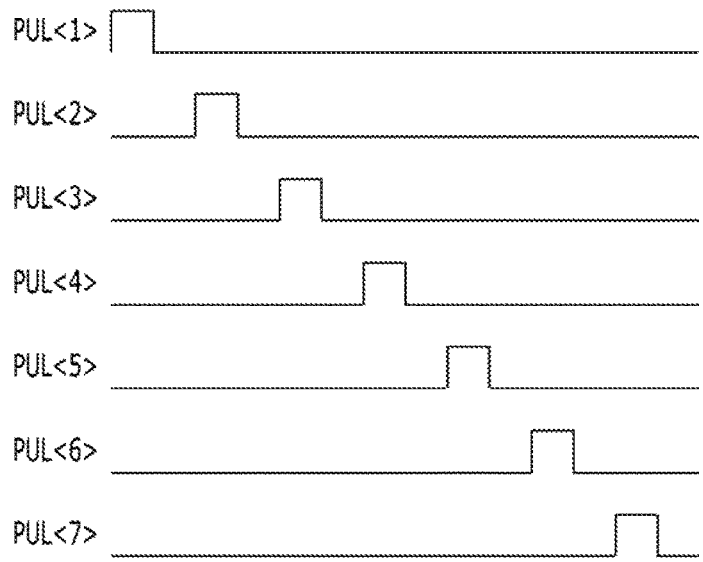
FIG. 7 is a waveform diagram explaining an operation of the pulse generation unit, according to an embodiment of the present invention.

FIG. 6 is a circuit diagram illustrating a configuration of a pulse generation unit 320, according to an embodiment of the present invention. FIG. 7 is a waveform diagram explaining the operation of the pulse generation unit 320.

Referring to FIG. 6, the pulse generation unit 320 may include AND gates AND1-AND7.

The AND gate AND1 may perform an AND operation on the first clock OSC<1> and the fifth clock OSC<5> to generate the first periodic pulse PUL<1>. The AND gate AND2 may perform an AND operation on the fifth clock OSC<5> and the second clock OSC<2> to generate the second periodic pulse PUL<2>. The AND gate AND3 may perform an AND operation on the second clock OSC<2> and the sixth clock OSC<6> to generate the third periodic pulse PUL<3>. The AND gate AND4 may perform an AND operation on the sixth clock OSC<6> and the third clock OSC<3> to generate the fourth periodic pulse PUL<4>. The AND gate AND5 may perform an AND operation on the third clock OSC<3> and the seventh clock OSC<7> to generate the fifth periodic pulse PUL<5>. The AND gate AND6 may perform an AND operation on the seventh clock OSC<7> and the fourth clock OSC<4> to generate the sixth periodic pulse PUL<6>. The AND gate AND7 may perform an AND operation on the fourth clock OSC<4> and the first clock OSC<1> to generate the seventh periodic pulse PUL<7>. Referring to FIG. 7, the first to seventh periodic pulse PUL<1>-PUL<7> have a phase increasing sequentially by a time interval obtained by dividing the basic period by "7".

Figure 8:
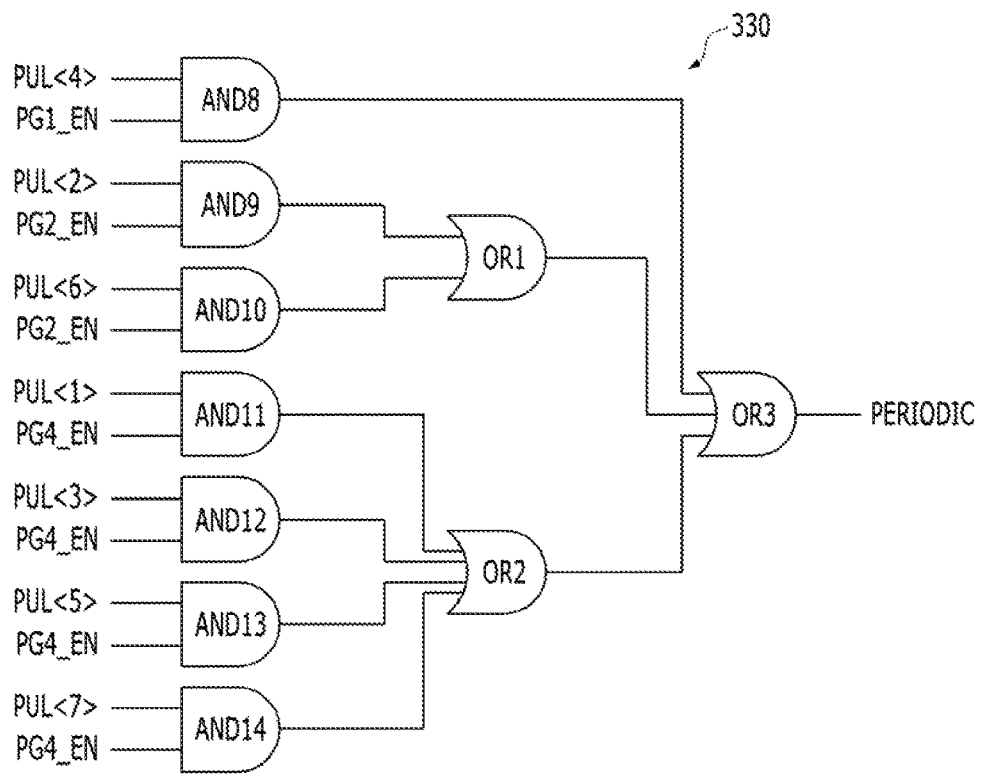
FIG. 8 is a circuit diagram illustrating a configuration of a periodic signal generation unit, according to an embodiment of the present invention.

Referring to FIG. 8, a periodic signal generation unit 330, according to an embodiment of the present invention may include a plurality of AND gates AND8-AND14 and OR gates OR1-OR3.

The AND gate AND8 may perform an AND operation on the fourth periodic pulse PUL<4> and the first combination signal PG1_EN. The AND gate AND9 may perform an AND operation on the second periodic pulse PUL<2> and the second combination signal PG2_EN. The AND gate AND10 may perform an AND operation on the sixth periodic pulse PUL<6> and the second combination signal PG2_EN. The AND gate AND11 may perform an AND operation on the first periodic pulse PUL<1> and the third combination signal PG4_EN. The AND gate AND12 may perform an AND operation on the third periodic pulse PUL<3> and the third combination signal PG4_EN. The AND gate AND13 may perform an AND operation on the fifth periodic pulse PUL<5> and the third combination signal PG4_EN. The AND gate AND14 may perform an AND operation on the seventh periodic pulse PUL<7> and the third combination signal PG4_EN.

The OR gate OR1 may perform an OR operation on the outputs of the AND gates AND9 and AND10. The OR gate OR2 may perform an OR operation on the outputs of the AND gates AND11, AND12, AND13 and AND14. The OR gate OR3 may perform an OR operation on the outputs of the AND gate AND8, the OR gate OR1 and the OR gate OR2.

Figure 9:
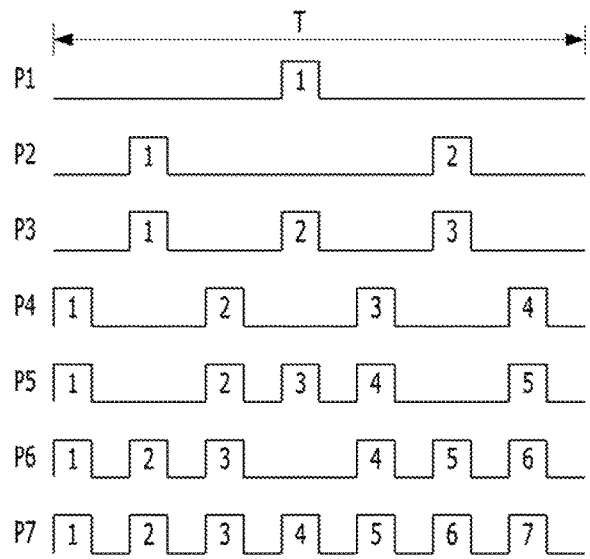
FIG. 9 is a diagram illustrating waveforms which a periodic signal may have, according to an embodiment of the present invention.

FIG. 9 is a diagram showing waveforms P1-P7 which a periodic signal PERIODIC may have, according to an embodiment of the present invention Table 2 shows a relation between combination information PG1_EN, PG2_EN and PG_EN and waveforms P1-P7 shown in FIG. 9.

TABLE 2

| PG1_EN | PG2_EN | PG4_EN | Waveform of Periodic Signal |
|---|---|---|---|
| 1 | 0 | 0 | P1 |
| 0 | 1 | 0 | P2 |
| 1 | 1 | 0 | P3 |
| 0 | 0 | 1 | P4 |

TABLE 2-continued

| PG1_EN | PG2_EN | PG4_EN | Waveform of Periodic Signal |
|---|---|---|---|
| 1 | 0 | 1 | P5 |
| 0 | 1 | 1 | P6 |
| 1 | 1 | 1 | P7 |

As a waveform varies from P1 to P7, the number of pulses included in a basic period T increases and the interval between pulses is reduced. When the interval between pulses of a signal is reduced represents that the period of the signal is shortened.

Figure 10:
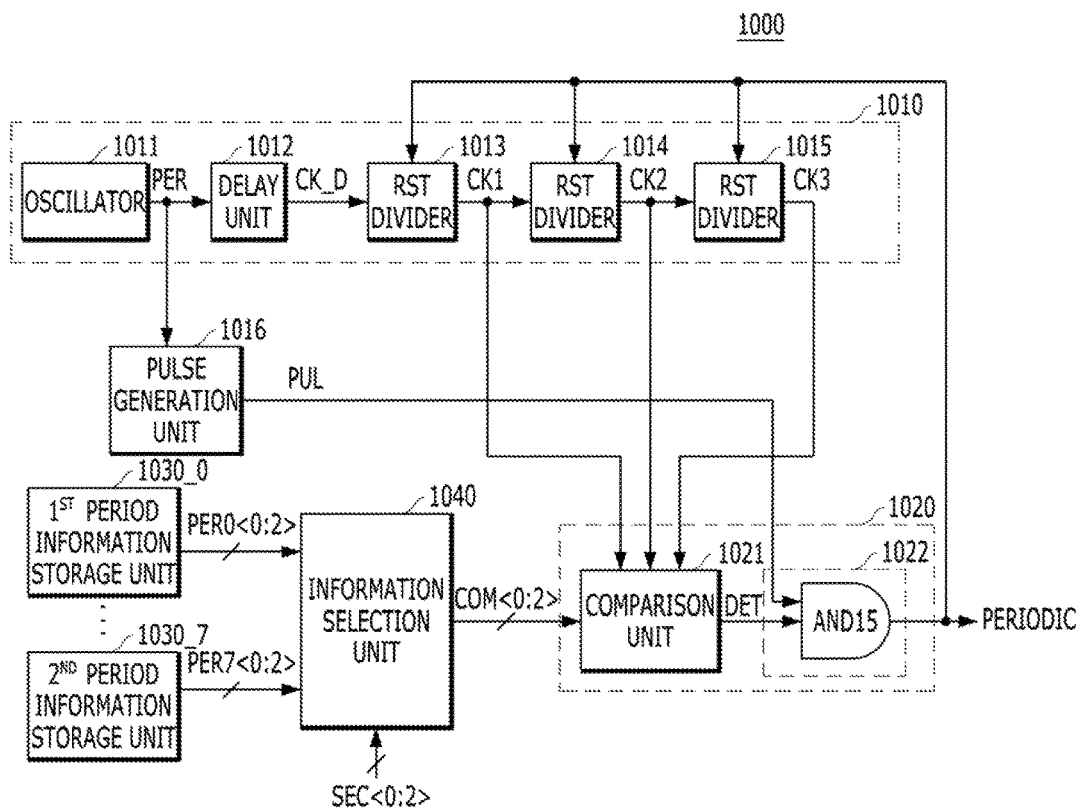
FIG. 10 is a block diagram illustrating a configuration of a periodic signal generation circuit, according to another embodiment of the present invention.

Referring to FIG. 10, a periodic signal generation circuit generally designated with numeral 1000, according to another embodiment of the present invention, may include a clock generation unit 1010, a periodic signal generation unWit 1020, first to $M^{th}$ period information storage units, for example period information storage units 1030_0-1030_7, and an information selection unit 1040.

The clock generation unit 1010 may generate first to $N^{th}$ division clocks CK1-CK3 by dividing a basic clock CK having a basic period from one to N times, respectively, wherein is a natural number from 1 to 3 for the example of FIG. 10. The clock generation unit 1010 may include an oscillator 1011, a delay unit 1012, first to third dividers 1013-1015, and a pulse generation unit 1016.

The oscillator 1011 may generate a basic clock CK having a basic period. The delay unit 1012 may generate a delayed clock CK_D by delaying the basic clock CK by one half the period of the basic clock CK. The delayed clock CK_D may be inputted to the first divider 1013.

The first to third dividers 1013-1015 generates first to third division clocks CK1-CK3 by dividing the frequency of the basic clock CK by various division ratios. Each of the dividers 1013-1015 divides a frequency of an input signal by two to generate an output signal. Therefore, the frequency of the first division clock CK1 may be one half of the frequency of the basic clock CK, the frequency of the second division clock CK2 may be one half of the frequency of the first division clock CK1, and the frequency of the third division clock CK3 may be one half of the frequency of the second division clock CK2. The relation between the periods of the clocks CK and CK1-CK3 may be inversely proportional to the relation between their frequencies. When a signal inputted to an initialization terminal RST may be activated, the first to third dividers 1013-1015 may be initialized to operate afresh from the beginning A periodic signal PERIODIC may be inputted to the initialization terminal RST. Therefore, the first to third dividers 1013-1015 may be initialized to operate afresh from the beginning whenever the periodic signal PERIODIC may be activated.

The pulse generation unit 1016 may generate a periodic pulse PUL having an assigned pulse width at a falling edge of a basic clock CK.

The periodic signal generation unit 1020 may transfer the periodic pulse PUL as the periodic signal PERIODIC when the value of clock information generated using a logic value of the first to $N^{th}$ division clocks CK1-CK3 is the same as the value of combination information COM<0:2>.

Clock information constituted by the division clocks CK1-CK3 may be substantially the same as counting information for performing a counting operation in a basic period. Therefore, the period of the periodic signal PERIODIC may be determined depending on the value of combination information COM<0:2>. For example, when the value of combination information is (0, 1, 0), the period of the periodic signal PERIODIC may be three times as long as the basic period; when the value of combination information i (1, 0, 1) the period of the periodic signal PERIODIC may be six times as long as the basic period.

The periodic signal generation unit 1020 may include a comparison unit 1021 and a signal transference unit 1022. The comparison unit 1021 may compare clock information obtained by combining the logic values of the first to $N^{th}$ division clocks CK1-CK3 with the combination information COM<0:2> to output a result DET thereof. The signal transference unit 1022 may transfer the periodic pulse as the periodic signal PERIODIC when the comparison result DET may indicate that the clock information is the same as the combination information COM<0:2>. The signal transference unit 1022 does not transfer the periodic pulse as the periodic signal PERIODIC when the comparison result DET indicates that clock information is different from the combination information COM<0:2>. The signal transference unit 1022 may include an AND gate AND15 to which the periodic pulse PUL and the comparison result DET may be inputted.

The first to $M^{th}$ period information storage units 1030_1-1030_7 may store and output assigned period information among first to $M^{th}$ period informations PER0<0:2>-PER7<0:2>. Each of the first to $M^{th}$ period information storage units 1030_1-1030_7 may be a fuse set which can program multi-bit information. The values of period information programmed in the first to $M^{th}$ period information storage units 1030_1-1030_7 may be set freely depending on designs.

Each of the first to $M^{th}$ period information PER0<0:2>-PER7<0:2> corresponds to one operation section among first to $M^{th}$ operation sections divided depending on the value of an assigned factor. Here, the assigned factor may be one of factors for defining the environments in which a semiconductor device including a periodic signal generation circuit operates, for example, a temperature.

The information selection unit 1040 may select one of the first to $M^{th}$ period informations PER0<0:2-PER7<0:2> in response to section information SEC<0:2> to output the selected period information as the combination information COM<0:2>. In this case, a first bit PER0<0>-PER7<0> of the selected period information may be outputted as a first combination signal COM<0> a second bit PER0<1>-PER7<1> of the selected period information may be outputted as a second combination signal COM<1>, and a third bit PER0<2>-PER7<2> of the selected period information may be outputted as a third combination signal COM<2>. The section information SEC<0:2> may be information representing an operation section in which a semiconductor device including a periodic signal generation circuit operates.

The periodic signal generation circuit shown in FIG. 10 enables the period of the periodic signal PERIODIC according to each operation section to be set freely to have a relatively simple circuit configuration using the comparison unit 1021.

Figure 11:
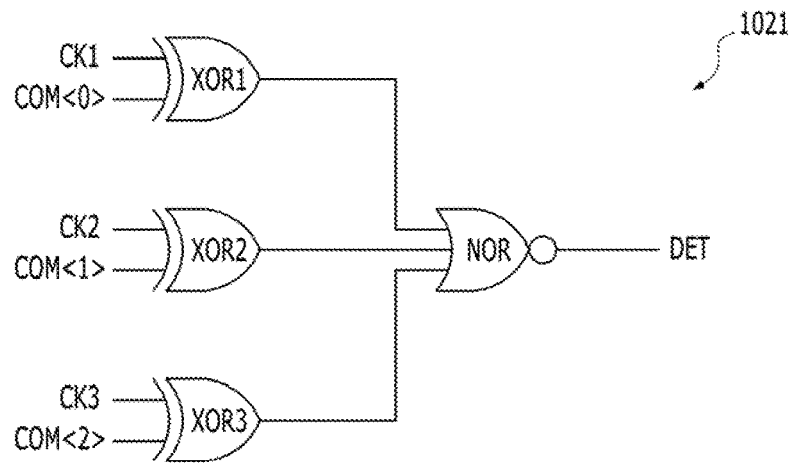
FIG. 11 is circuit diagram illustrating a configuration of a comparison unit, according to another embodiment of the present invention.

Referring to FIG. 11, a comparison unit 1021, according to another embodiment of the present invention may include a plurality of gates XOR1-XOR3 and NOR.

The exclusive OR gate XOR1 may perform an XOR operation on the first division clock CK1 and the first combination signal COM<0>. The exclusive OR gate XOR2 may perform an XOR operation on the second division clock CK2 and the second combination signal COM<1>. The exclusive OR gate XOR3 may perform an XOR operation on the third division clock CK3 and the third combination signal COM<2>. The NOR gate NOR may perform a NOR operation on the outputs of the exclusive OR gates XOR1, XOR2 and XOR3 to generate a comparison result DET.

Figure 12:
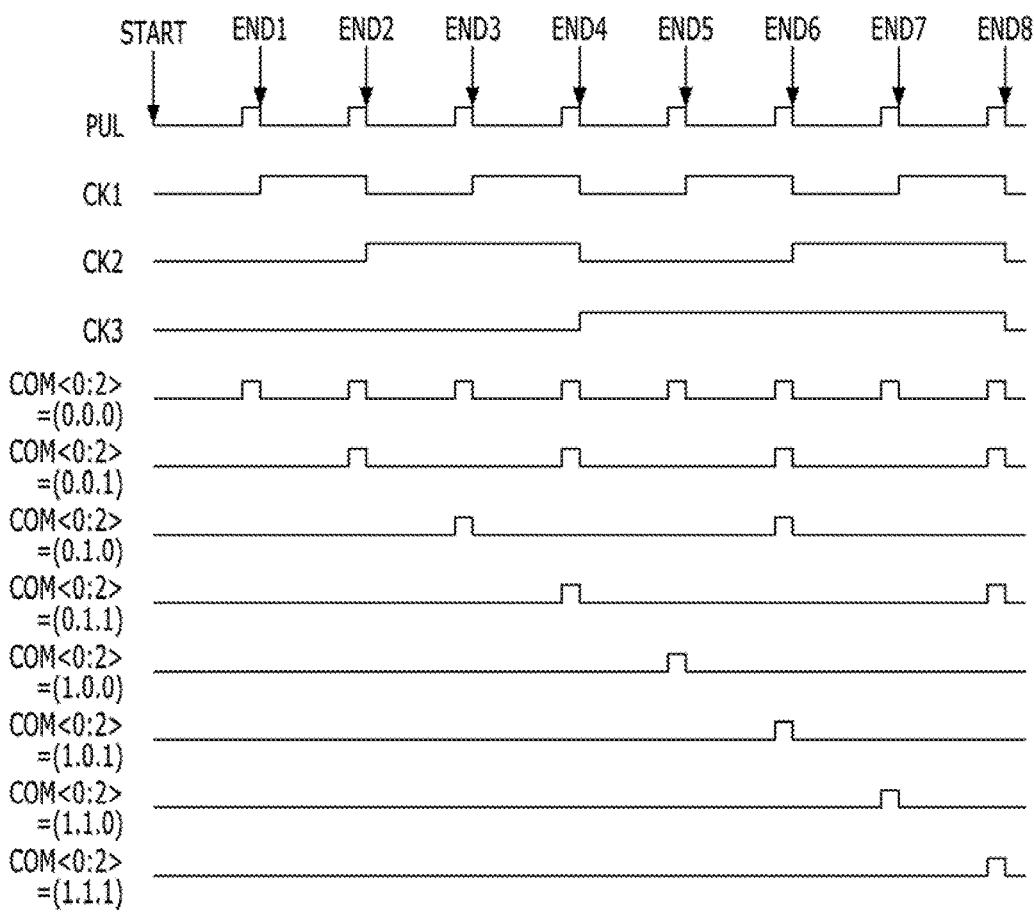
FIG. 12 is a waveform diagram explaining an operation of the periodic signal generation circuit, according to another embodiment of the present invention.

FIG. 12 is a waveform diagram explaining the operation of the periodic signal generation circuit according to another embodiment of the present invention.

Referring to FIG. 12, a periodic pulse PUL may be transferred as a periodic signal PERIODIC in mutually different periods depending on the values of combination information COM<0:2>. The dividers 1013-1015 may be initialized when the periodic pulse PUL may be transferred as the periodic signal PERIODIC. Therefore, in each case, the waveforms of the division clocks CK1-CK3 may be formed in such a manner that the waveform of a section from an initialization time START to a time END1-END8 at which the periodic pulse PUL may be transferred as the periodic signal PERIODIC may be repeated.

In a case where the combination in formation COM<0:2> may be COM<2>=0, COM<1>=0 and COM<0>=0 and the clock informations (CK3, CK2, CK1) may be (0, 0, 0), the periodic pulse PUL may be transferred as the periodic signal PERIODIC. Therefore, in this case, the waveform from the initialization time START to the end time END1 may be repeated, and the period of the periodic signal PERIODIC may be same as the basic period.

In a case where the combination information COM<0:2> may be (0, 0, 1) and the clock informations may be (0, 0, 1), the periodic pulse PUL may be transferred as the periodic signal PERIODIC. Therefore, in this case, the waveform from the initialization time START to an end time END2 may be repeated, and the period of the periodic signal PERIODIC may become twice as long as the basic period.

In each case where the combination informations COM<0:2> may be (0, 1, 0) to (1, 1, 1) and the clock informations may be (0, 1, 0) to (1, 1, 1), respectively, the periodic pulse PUL may be transferred as the periodic signal PERIODIC. Therefore, in these cases, waveforms from the initialization time START to the respective end times END3-END8 may be respectively repeated, and the periods of the periodic signals PERIODIC may become three to eight times as long as the basic period, respectively.

Figure 13:
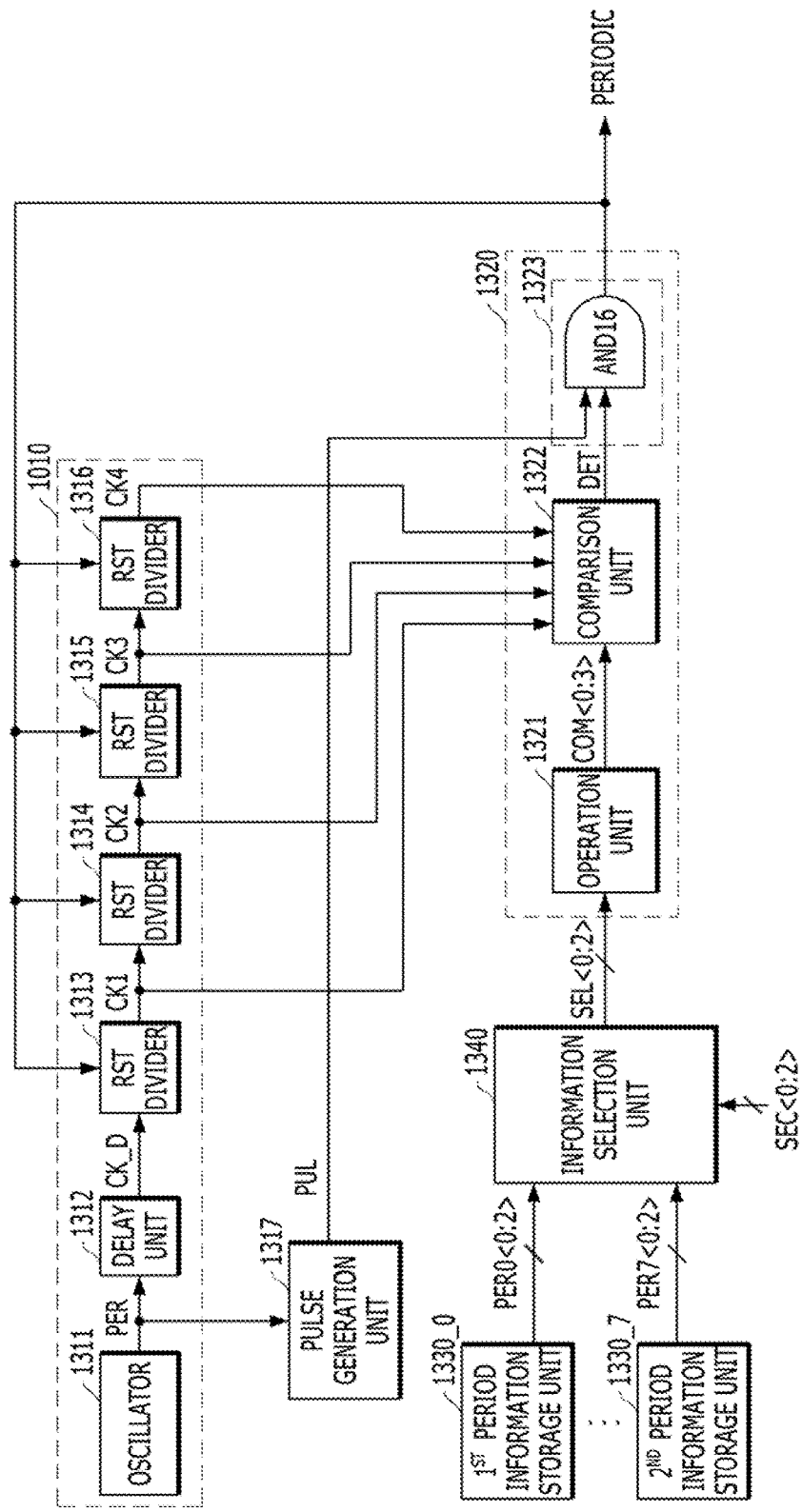
FIG. 13 is a block diagram illustrating a configuration of a periodic signal generation circuit, according to the other embodiment of the present invention.

Referring to FIG. 13, a periodic signal generation circuit according to the other embodiment of the present invention may include a clock generation unit 1310, a periodic signal generation unit 1320, first to $M^{th}$ period information storage units 1330_1-1330_7, and an information selection unit 1340.

The clock generation unit 1310 may generate first to $N^{th}$ division clocks CK1-CK4 by dividing a basic clock CK having a basic period one to N times, respectively. The clock generation unit 1310 may include an oscillator 1311, a delay unit 1312, first to fourth dividers 1313-1316, and a pulse generation unit 1317.

The oscillator 1311 may generate a basic clock CK having a basic period. The delay unit 1312 generate a delayed clock CK_D by delaying the basic clock CK by half the period of the basic clock CK. The delayed clock CK_D may be inputted to the first divider 1313.

The first to fourth dividers 1313-1316 may generate first to fourth division clocks CK1-CK4 by dividing a frequency of the basic clock CK by various division ratios. Each of The dividers 1313-1316 may divide the frequency of an input signal by two to generate an output signal. Therefore, the frequency of the first division clock CK1 may be one half of the frequency of the basic clock CK, the frequency of the second division clock CK2 may be one half of the frequency of the first division clock CK1, the frequency of the third division clock CK3 may be one half of the frequency of the second division clock CK2, and the frequency of the fourth division clock CK4 may be one half of the frequency of the third division clock CK3.

When a signal inputted to an initialization terminal RST is activated, the first to fourth dividers 1313-1316 may be initialized to operate afresh from the beginning. The periodic signal PERIODIC may be inputted to the initialization terminal RST. Therefore, the first to fourth dividers 1313-1316 may be initialized to operate afresh from the beginning whenever the periodic signal PERIODIC is activated.

The pulse generation unit 1317 may generate the periodic pulse PUL having an assigned pulse width at a falling edge of a basic clock CK.

The periodic signal generation unit 1320 may transfer the periodic pulse PUL as the periodic signal PERIODIC when the value of clock information generated using a logic value of the first to $N^{th}$ division clocks CK1-CK4 is the same as the value of combination information COM<0:3>. The periodic signal generation unit 1320 may include an operation unit 1321, a comparison unit 1322, and a signal transference unit 1323.

The operation unit 1321 may generate the combination information COM<0:3> by performing an assigned operation on information SEL<0:2> outputted by the information selection unit 1340. For example, the operation unit 1321 may generate the combination information COM<0:3> by performing an operation of "2×output information SEL<0:2>−1=COM<0:3>". The comparison unit 1322 may compare clock information obtained by combining the logic values of the first to $N^{th}$ division clocks CK1-CK4 with the combination information COM<0:3> to output a comparison result DET. The signal transference unit 1323 may transfer the periodic pulse as the periodic signal PERIODIC when the comparison result DET indicates that the clock information is the same as the combination information COM<0:3>. The signal transference unit 1323 does not transfer the periodic pulse as the periodic signal PERIODIC when the comparison result DET indicates that the clock information is different from the combination information COM<0:3>. The signal transference unit 1323 may include an AND gate AND16 to which the periodic pulse PUL and the comparison result DET are inputted.

Clock information constituted by the division clocks CK1-CK4 may be substantially the same as an output of a counting circuit for performing a counting operation with a basic period. Therefore, the period of the periodic signal PERIODIC may be determined depending on the value of the combination information COM<0:3>. For example, when the value of the combination information is (0, 1, 1, 0), the period of the periodic signal PERIODIC may be seven times as long as the basic period; when the value of the combination information is (1, 0, 0, 1), the period of the periodic signal PERIODIC may be ten times as long as the basic period.

The configurations and operations of the first to $M^{th}$ period information storage units 1330_1-1330_7 and the information selection unit 1340 may be the e as the configurations and operations of the first to $M^{th}$ period information storage units 1030_1-1030_7 and the information selection unit 1040.

Hence, the periodic signal generation circuit 1300 according to the embodiment of FIG. 13, the period of the periodic signal PERIODIC according to each operation section to be set freely to have a relatively simple circuit configuration using the operation unit 1321 and the comparison unit 1322.

Unlike the periodic signal generation circuit 1000 of FIG. 10, the periodic signal generation circuit 1300 of FIG. 13 enables the period of the periodic signal PERIODIC to be more variable by using the operation unit 1321.

For reference Table 3 shows a relation between combination information COM<0:3> and information SEL<0:2> outputted when the operation unit 1321 may perform an operation of "2X−1". The operation performed by the operation unit 1321 and the circuit constituting the operation unit 1321 may vary depending on designs.

TABLE 3

| Output Information (SEL<0:2>) | Combination Information COM<0:3> |
|---|---|
| (0, 0, 0) | — |
| (0, 0, 1) | (0, 0, 0, 1) |
| (0, 1, 0) | (0, 0, 1, 1) |
| (0, 1, 1) | (0, 1, 0, 1) |
| (1, 0, 0) | (0, 1, 1, 1) |
| (1, 0, 1) | (1, 0, 0, 1) |
| (1, 1, 0) | (1, 0, 1, 1) |
| (1, 1, 1) | (1, 1, 0, 1) |

Figure 14:
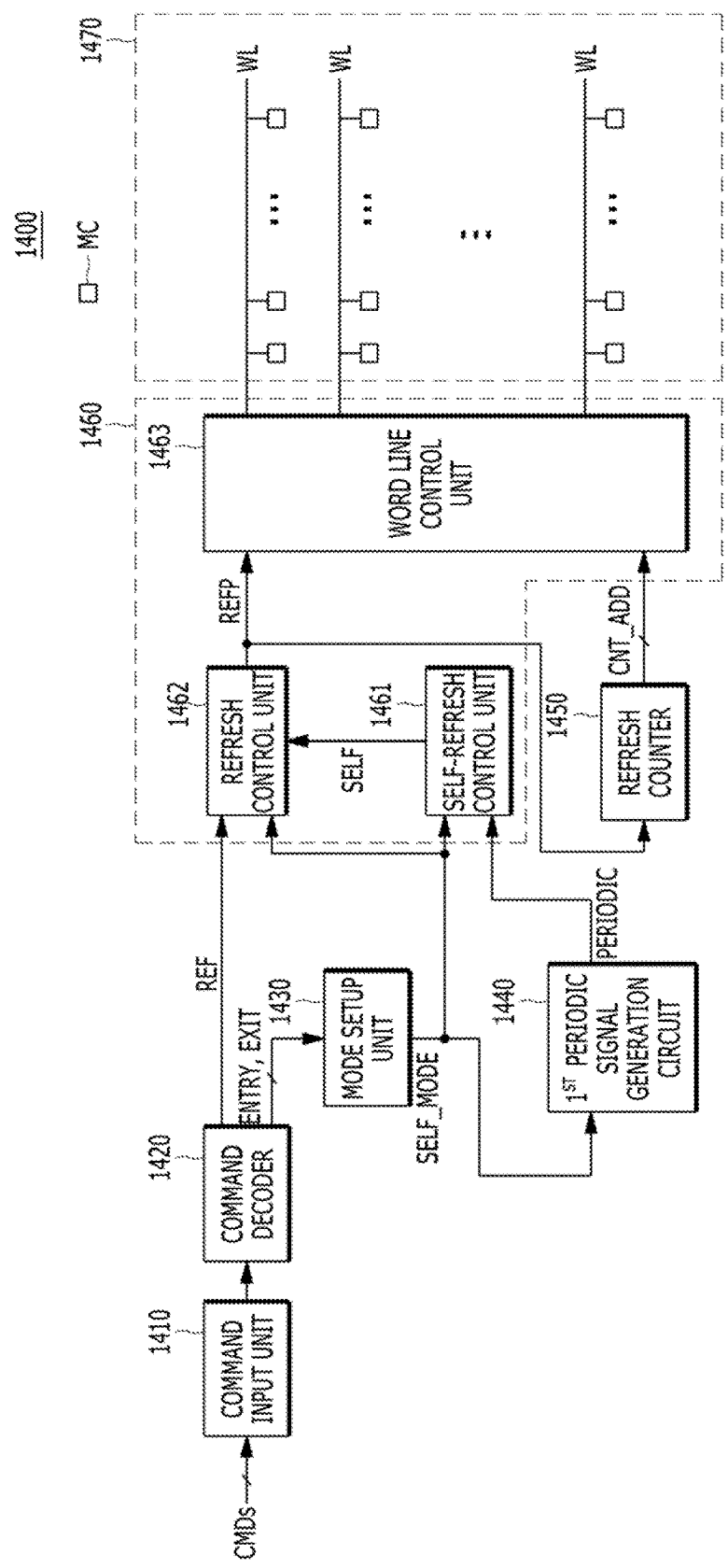
FIG. 14 is a block diagram illustrating a configuration of memory device, according to an embodiment of the present invention.

Referring to FIG. 14, a memory device 1400, according to an embodiment of the present invention, may include a command input unit 1410, a command decoder 1420, a mode setup unit 1430, a periodic signal generation circuit 1440, a refresh counter 1450, a control circuit 1460, and a cell array 1470. The cell array 1470 may include a plurality of word lines WL, each of which is coupled to one or more memory cells MC.

The command input unit 1410 may receive commands CMDs. The commands CMDs may include multi-bit signals. The command decoder 1420 may decode the command signals CMDs inputted through the command input unit 1410 to generate a refresh command REF, a self-refresh entry command ENTRY, and a self-refresh exit command EXIT. The command decoder 1420 may activate a command, indicated by a combination of the input command signals CMDs, among the refresh command REF, the self-refresh entry command ENTRY, and the self-refresh exit command EXIT.

The mode setup unit 1430 may set a self-refresh mode of a memory device. The mode setup unit 1430 may control a memory device to enter the self-refresh mode in response to the self-refresh entry command ENTRY, and terminate the self-refresh mode in response to the self-refresh exit command EXIT. To this end, the mode setup unit 1430 may activate a self-refresh mode signal SELF_MODE representing the self-refresh mode in response to the self-refresh entry command ENTRY, and inactivate the self-refresh mode signal SELF_MODE in response to the self-refresh exit command EXIT.

The periodic signal generation circuit 1440 may generate a periodic signal PERIODIC when the self-refresh mode signal SELF_MODE is activated. An interval i.e. period, at which a pulse activated in such a periodic signal PERIODIC may vary depending on period information PER<0:2>. Such period information PER<0:2> may relate to temperature, wherein as the temperature increases, a binary value corresponding to the period information PER<0:2> also increases, and thus the period of the periodic signal PERIODIC may be shorter.

The control circuit 1460 may refresh the cell array 1470 in response to the refresh command REF, wherein the control circuit 1460 may refresh the cell array 1470 with a period corresponding to the period of a periodic signal PERIODIC in the self-refresh mode (a section in which the self-refresh mode signal SELF_MODE has been activated).

For this operation, the control circuit 1460 may include a self-refresh control unit 1461, a refresh control unit 1462, and a word line control unit 1463. The self-refresh control unit 1461 may activate a self-refresh signal SELF with a period corresponding to the period of the periodic signal PERIODIC when the self-refresh mode signal SELF_MODE may be activated. The refresh control unit 1462 may activate a refresh signal REFP in response to the refresh command REF, wherein the refresh control unit 1462 may activate the refresh signal REFP in response to the self-refresh signal SELF when the self-refresh mode signal SELF_MODE may be activated. When the refresh signal REFP may be activated, the word line control unit 1463 may refresh a word line L corresponding to a counting address CNT_ADD.

The refresh counter 1450 generates the counting address CNT_ADD, wherein the refresh counter 1450 varies the value of the counting address CNT_ADD whenever the refresh signal REFP is activated. The refresh counter 1450 may increase the value of the counting address CNT_ADD by a single digit whenever the refresh signal REFP is activated. Increasing the value of the counting address CNT_ADD by a single digit means varying counting information to select a $(K+1)^{th}$ word line WLK+1 in the next turn when a $K^{th}$ word line WLK has been previously selected.

The memory device may refresh the plurality of word lines WL included in the cell array 1470 in a regular sequence in response to the refresh command REF when the memory device is not in the self-refresh mode. The memory device may refresh the plurality of word lines WL in response to the self-refresh signal SELF in the self-refresh mode. In this case, the period of the self-refresh may be determined depending on the temperature, and the periodic signal generation circuit shown in FIG. 3 may be used as the periodic signal generation circuit 1440, thereby reducing the required area and performing the self-refresh operation in various periods depending on the temperature.

Although FIG. 14 illustrates the case where the periodic signal generation circuit according to an embodiment of the present invention may be applied for the self-refresh operation of the memory device, the periodic signal generation circuit of the present invention may be applied to all types of integrated circuits, semiconductor devices and the like, that can operate in a period which may vary depending on the value of an assigned information such as for example an operating temperature. For example, the periodic signal generation circuit of the present invention may be applied to a voltage pumping circuit and the like, a pumping period of which varies depending on operation environments. In addition, we note that the number of the various clocks, pulse signals and division clocks used in the periodic signal generation circuit may vary depending on designs.

A memory device comprising: a cell array comprising a plurality of memory cells; a clock generation unit suitable for generating a plurality of clocks having assigned periods, respectively; first to $M^{th}$ period information storage units suitable for storing assigned period information among first to $M^{th}$ period information; an information selection unit suitable for selecting and outputting one of the first to $M^{th}$ period information in response to section information; a signal generation unit suitable for generating a periodic signal having a period corresponding to combination information using the plurality of clocks and the combination information which is generated by using an output of the information selection unit; and a refresh control unit suitable for controlling the cell array to be refreshed in a period corresponding to the periodic signal in a self-refresh mode.

The refresh control unit is suitable for controlling the cell array to be refreshed one or more times when a refresh command is applied in a mode other than the self-refresh mode.

The first to $M^{th}$ period information is suitable for corresponding to one operation section among first to $M^{th}$ operation sections divided depending on a value of an assigned factor, and the one operation section is suitable for representing an operation section, among the first to $M^{th}$ operation sections, in which the memory device operates.

The assigned factor comprises temperature.

The clock generation unit is suitable for generating first to $N^{th}$ clocks which have a basic period and have a phase increasing in sequentially by a time interval obtained by dividing the basic period by "N", and the signal generation unit comprises: a pulse generation unit suitable for generating generate first to $N^{th}$ periodic pulses having an equal pulse width and having a phase increasing sequentially by a time interval obtained by dividing the basic period by "N" by combining two or more clocks among the first to $N^{th}$ clocks; and a periodic signal generation unit suitable for generating generate the periodic signal by combining one or more periodic pulses among the first to $N^{th}$ periodic pulses depending on the combination information.

The combination information comprises first to $L^{th}$ combination signals corresponding to mutually different periodic pulses, respectively, among the first to $N^{th}$ periodic pulses wherein a $K^{th}$ combination signal among the first to $L^{th}$ combination signals corresponds to $2^{K-1}$ periodic pulses among the first to $N^{th}$ periodic pulses; and the periodic signal generation unit is suitable for outputting the periodic signal by combining the periodic pulses corresponding to an activated combination signal among the first to $L^{th}$ combination signals.

The clock generation unit is suitable for generating first to $N^{th}$ division clocks by dividing a basic clock having a basic period one or N times, respectively; the periodic signal generation unit is suitable for transferring the periodic pulse having the basic period as the periodic signal when a value of clock information generated using a logic value of the first to $N^{th}$ division clocks is equal to a value of the combination information; and the clock generation unit is initialized when the periodic pulse is transferred as the periodic signal.

According to the embodiments of the present invention, periodic signals having various periods can be generated while the size of a periodic signal generation circuit can be reduced compared to existing circuits.

In addition, according to the embodiments of the present invention the self-refresh operation can be performed in a period set depending on an assigned information such as an operating temperature of a memory device, while at the same time the size of the memory device can be reduced also Although various embodiments have been described for illustrative purposes, it will be apparent to those skilled in the art that various changes and modifications may be made without departing from the spirit and/or scope of the invention as defined in the follow claims.

What is claimed is:

1. A periodic signal generation circuit comprising:
   a clock generation unit suitable for generating first to $N^{th}$ division clocks by dividing a frequency of a basic clock having a basic period from one to N times, respectively, so as to have periods different from each other; and
   a periodic signal generation unit suitable for transferring a periodic pulse having the basic period as a periodic signal when a logic value of the first to $N^{th}$ division clocks is equal to a value of combination information, wherein the combination information is obtained from one of first to Mth operation sections divided depending on an assigned factor comprising a temperature,
   wherein the clock generation unit is initialized when the periodic pulse is transferred as the periodic signal.

2. The periodic signal generation circuit of claim 1, further comprising:
   first to $M^{th}$ period information storage units suitable for storing assigned period information among first to $M^{th}$ period information; and
   an information selection unit suitable for selecting one of the first to $M^{th}$ period information in response to section information, and outputting the selected period information as the combination information.

3. The periodic signal generation circuit of claim 2, wherein the first to Mth period information is suitable for corresponding to one operation section among the first to Mth operation sections divided depending on the assigned factor, and
   the one operation section is suitable for representing an operation section, among the first to Mth operation sections, in which the periodic signal generation circuit operates.

4. The periodic signal generation circuit of claim 1, wherein the periodic signal generation unit comprises:
   a comparison unit suitable for comparing a logic value of the first to $N^{th}$ division clocks with the combination information when the output of the information selection unit corresponds to the combination information; and
   a signal transference unit suitable for transferring the periodic pulse as the periodic signal when a comparison result of the comparison unit indicates that the logic value of the first to $N^{th}$ division clocks is equal to the combination information; and not transferring the periodic pulse as the periodic signal when the comparison result of the comparison unit indicates that the logic value of the first to $N^{th}$ division clocks is different from the combination information.

5. The periodic signal generation circuit of claim 1, wherein the periodic signal generation unit comprises:
   an operation unit suitable for performing an assigned operation on the output of the information selection unit and generating the combination information;
   a comparison unit suitable for comparing a logic value of the first to $N^{th}$ division clocks with the combination information; and
   a signal transference unit suitable for transferring the periodic pulse as the periodic signal when the comparison result of the comparison unit indicates that the logic value of the first to $N^{th}$ division clocks is equal to the combination information; and not transferring the periodic pulse as the periodic signal when the comparison result of the comparison unit indicates that the logic value of the first to $N^{th}$ division clocks is different from the combination information.

* * * * *